(12) United States Patent
Leoncavallo

(10) Patent No.: US 8,203,367 B2
(45) Date of Patent: Jun. 19, 2012

(54) FREQUENCY DIVIDER AND METHOD FOR FREQUENCY DIVISION

(75) Inventor: Ruggero Leoncavallo, Gratkorn (AT)

(73) Assignee: austriamicrosystems AG, Unterpremstätten (AT)

( * ) Notice: Subject to any disclaimer, the term of this patent is extended or adjusted under 35 U.S.C. 154(b) by 118 days.

(21) Appl. No.: 12/738,405

(22) PCT Filed: Oct. 1, 2008

(86) PCT No.: PCT/EP2008/063177
§ 371 (c)(1),
(2), (4) Date: Sep. 1, 2010

(87) PCT Pub. No.: WO2009/050039
PCT Pub. Date: Apr. 23, 2009

(65) Prior Publication Data
US 2011/0044424 A1    Feb. 24, 2011

(30) Foreign Application Priority Data
Oct. 16, 2007 (EP) .................................. 07020252

(51) Int. Cl.
*H03B 19/00* (2006.01)
(52) U.S. Cl. ......... 327/117; 327/114; 327/116; 327/119
(58) Field of Classification Search .............. 327/115, 327/116, 117, 118, 355–360, 202, 203, 208–212, 327/218; 377/47, 48
See application file for complete search history.

(56) References Cited

U.S. PATENT DOCUMENTS

| | | | |
|---|---|---|---|
| 5,907,589 A * | 5/1999 | Koifman et al. | 377/47 |
| 6,831,489 B2 * | 12/2004 | Cheung et al. | 327/115 |
| 7,521,976 B1 * | 4/2009 | Sudjian et al. | 327/199 |
| 2003/0052720 A1 * | 3/2003 | Tung et al. | 327/218 |
| 2005/0127959 A1 * | 6/2005 | Leifso et al. | 327/117 |
| 2006/0208775 A1 | 9/2006 | Tobita et al. | |
| 2007/0286328 A1 * | 12/2007 | Molnar et al. | 377/47 |
| 2008/0136483 A1 * | 6/2008 | Sanduleanu et al. | 327/218 |
| 2009/0289671 A1 * | 11/2009 | Lin | 327/115 |
| 2010/0134154 A1 * | 6/2010 | He | 327/115 |
| 2010/0281289 A1 * | 11/2010 | Chang et al. | 713/400 |
| 2011/0150168 A1 * | 6/2011 | Tseng et al. | 377/47 |

FOREIGN PATENT DOCUMENTS
EP    0 766 402    4/1997

OTHER PUBLICATIONS

J. Craninckx et al.: "A 1.75-GHz/3-V Dual-Modulus Divide-by-128/129 Prescaler in 0.7-[mu]m CMOS", IEEE Journal of Solid State Circuits, IEEE Service, vol. 31, No. 7, Jul. 1996.

* cited by examiner

*Primary Examiner* — Lincoln Donovan
*Assistant Examiner* — Brandon s Cole
(74) *Attorney, Agent, or Firm* — Cozen O'Connor

(57) ABSTRACT

A frequency divider and a method for frequency division are disclosed that can achieve a balanced duty cycle when performing a frequency division with an odd division ratio, independently of an input frequency.

10 Claims, 2 Drawing Sheets

FREQUENCY DIVIDER AND METHOD FOR FREQUENCY DIVISION

RELATED APPLICATION

This is a U.S. National Phase Application under 35 USC §371 of International Application PCT/EP2008/063177 filed on Oct. 1, 2008.

This patent application claims the priority of European patent application no. 07020252.8 filed Oct. 16, 2007, the disclosure content of which is hereby incorporated by reference.

FIELD OF THE INVENTION

The invention relates to a frequency divider and to a method for frequency division.

BACKGROUND OF THE INVENTION

There are several applications where a frequency division is needed, for example in frequency generation circuits or frequency synthesizers. Frequency dividers with an even division ratio, for example by two or four, are widely known. In some cases, frequency dividers with an odd division ratio can be needed.

In one existing implementation of a conventional frequency divider with an odd division ratio, a number N of D-flip-flops are cascaded to achieve a division ratio of 2N−1. An input of the first flip-flop is coupled to an output of a NOR-gate having a first input coupled to the output of the first flip-flop and a second input coupled to an output of the N-th flip-flop. Respective clock inputs of the N flip-flops are provided with an input frequency signal. After the N-th flip-flop, an additional flip-flop clocked by the input frequency signal and an AND-gate are provided to perform a synchronization of the divided clock signal. With the synchronization, a balanced duty cycle of about 50% should be achieved.

Logic AND-gates usually have an asymmetry regarding their rise time and fall time as well as their switching from one logic state to another. Furthermore an asymmetry of an AND-gate can be caused by differing switching times between a first and a second input for respective switched logical input signals. If the symmetry in the AND-gate and an input to output delay in the last flip-flop are negligible to a signal period of the input frequency signal, usually a satisfying duty cycle performance can be achieved with a conventional frequency divider. As the signal period of the input frequency signal decreases with an increasing input frequency, the asymmetry of the AND-gate and the delay of the last flip-flop can have a negative influence on the duty cycle performance, depending on the input signal frequency.

SUMMARY OF THE INVENTION

It is an object of the invention to provide a frequency divider and a method for frequency division which are able to achieve a balanced duty cycle when performing a frequency division with an odd division ratio, independently of an input frequency.

In one exemplary embodiment, a frequency divider comprises a first and a second triggered delay element, a reference frequency input and a clock output. Each of the delay elements has a data input, a clock input, a trigger control input and a data output. The delay elements are configured to forward a state of an input signal at their respective data input to their respective data output either for a rising clock edge of a clock signal at their respective clock input or for a falling clock edge of a clock signal, depending on a control signal at their respective trigger control input. In other words, it depends on a control signal at the respective trigger control input of the delay element whether the state is forwarded either for a rising clock edge of the clock signal or for a falling clock edge of the clock signal. The clock input of each of the delay elements of the cascade is coupled to the reference frequency input. The data input and the trigger control input of the first delay element of the cascade are coupled to the data output of the last delay element of the cascade. The data input and the trigger control input of further delay elements of the cascade are coupled to the data output of a respective preceding delay element of the cascade and the clock output is coupled to the data output of the last delay element of the cascade. Hereby the trigger control input of one of the delay elements of the cascade is coupled to the corresponding data output by inverting means and the respective data input of the other delay elements of the cascade is coupled to the corresponding data output by respective inverting means.

In other words, for one of the delay elements of the cascade inverting means are provided at its trigger control input, whereas the data input of this delay element is coupled to said data output directly, for example without inverting means. For the remaining delay elements of the cascade, inverting means are provided at the respective data inputs, whereas the trigger control inputs of said delay elements are coupled to corresponding data outputs directly.

With this embodiment of a frequency divider, an odd division ratio between an input clock signal at the reference frequency input and an output frequency at the clock output can be achieved. As the triggered delay elements are triggered either by a positive or rising clock edge of the clock signal or a negative, falling clock edge to achieve the odd division ratio, for example in an alternating fashion, the output clock signal at the data output of the second delay element has a symmetric wave form, which is not dependent on the frequency of the input clock signal. In other words, a balanced duty cycle of 50% can be achieved without the need for an additional flip-flop or delay element and without an AND-gate. Therefore, a frequency divider according to this embodiment can be implemented with less effort than a conventional frequency divider. The symmetry of the frequency divider is also improved because no devices or blocks need to be used which have an asymmetric behavior.

In another exemplary embodiment, a frequency divider comprises a first and a second triggered delay element and a clock output. Each of the delay elements has a data input, a clock input, a trigger control input and a data output. The delay elements are configured to forward a state of an input signal at their respective data input to their respective data output either for a rising clock edge of an input clock signal or for a falling clock edge of the input clock signal, depending on a control signal at their respective trigger control input. In other words, it depends on a control signal at the respective trigger control input of the delay element whether the state is forwarded either for a rising clock edge of the clock signal or for a falling clock edge of the clock signal. The data input and the trigger control input of the first delay element are coupled to the clock output, wherein one input of said data input and said trigger control input is coupled to the clock output by first inverting means. The other input of said inputs is coupled to the clock output directly, for example without inverting means. The data input and the trigger control input of the second delay element are coupled to the data output of the first delay element, wherein one input of said data input and said trigger control input is coupled to said data output by second inverting means in a complementary fashion with respect to the coupling at the input of the first delay element. Accordingly, the other input of said inputs of the second delay element is coupled to the data output of the first delay element directly. The clock output is coupled to the data output of the second delay element.

For example with this embodiment a division ratio of three can be achieved between an input clock signal and an output clock signal at the clock output.

To get higher numbered odd division ratios, a third triggered delay element can be provided additionally, having a data input and a trigger control input coupled to the data output of the second delay element, and a data output coupled to the clock output. Herein said data input is coupled to said data output by third inverting means, whereas said trigger control input is coupled to said data output directly. The function of the third delay element corresponds to the function of the first and the second delay elements such that it forwards input states either for rising clock edges or for falling clock edges of the input clock signal, depending on a control signal.

In one embodiment of a triggered delay element, which can be used in the embodiments described above, the triggered delay element comprises a selection unit and a first and a second auxiliary delay element. The auxiliary delay elements each have an auxiliary data input which are coupled to the data input of the triggered delay elements. A clock input of the first auxiliary delay element is coupled to a clock input of the triggered delay element directly and the clock input of the second auxiliary delay element is coupled to the clock input of the triggered delay element by auxiliary inverting means. Auxiliary data outputs of the auxiliary delay elements are coupled to a first and a second signal input of the selection unit. The auxiliary delay elements are configured to forward the state of an input signal at the respective auxiliary data input to the respective auxiliary data output, depending on a clock edge of a clock signal at the respective clock input. The selection unit has a selection input which is coupled to the trigger control input of the triggered delay element, wherein the selection unit is configured to couple the first or the second signal input to a signal output, depending on a selection signal at the selection input. The signal output of the selection unit is coupled to the data output of the triggered delay element.

Accordingly, a first and a second auxiliary data signal are derived by forwarding a state of a signal at the data input in one case at a rising clock edge of the input clock signal and in the other case at a falling clock edge of the input clock signal. Depending on the selection signal, the first or the second auxiliary data signal are selected to be forwarded as the output signal of the triggered delay element.

In several embodiments, the frequency divider is configured to be operated with differential signals. In other words, the input clock signal, the output clock signal and the data signals between the delay elements can be in the form of differential signals which comprise a first and a second component which have a signal level complementary with respect to a reference level. In this case, an inversion or a negation of one of the signals can be performed by exchanging or swapping the first and the second component. In a practical implementation, this can be performed by swapping differential lines which are configured to carry or transport the differential components of the respective differential signal. In other words, the inverting means can comprise swapped differential lines.

In other embodiments, as well for single-ended signals as for differential signals, the inverting means can also comprise inverter circuits which, for example, are transistor-based.

In one exemplary embodiment of a method for frequency division, an input clock signal is provided. A first input state of a plurality of at least two input states is derived from a last data signal of a plurality of at least two data signals. Furthermore, a first selection signal of a plurality of at least two selection signals is derived from the last data signal, wherein the first selection signal pertains to the first input state. A first data signal of the plurality of at least two data signals is derived by forwarding the first input state either at a rising clock edge of the input clock signal or at a falling clock edge of the input clock signal, depending on the first selection signal. A further input state of the plurality of at least two input states is derived from a respective preceding data signal of the plurality of at least two data signals. Accordingly, a further selection signal of the plurality of at least two selection signals is derived from the respective preceding data signal, wherein the further selection signal pertains to the further input state. A further data signal of the plurality of at least two data signals is derived by forwarding the further input state either at the rising clock edge of the input clock signal or at the falling clock edge of the input clock signal, depending on the further selection signal. An output clock signal is derived from one data signal of the plurality of at least two data signals, for example from the last data signal. Hereby one of the plurality of at least two selection signals is derived by inverting the corresponding data signal, and the input states not pertaining to said one selection signal are derived by inverting the corresponding data signals.

In other words, a plurality of at least two sets of input states and selection signals pertaining to each other are derived from respective data signals in a cascaded fashion. Hereby for the first set the last data signal, which is derived from the last set, is evaluated. For the further sets of input states and selection signals pertaining to each other a respective data signal derived from a preceding set is evaluated. In one of the sets the selection signal is derived by inverting the corresponding data signal, whereas a pertaining input state is derived by taking the state of the corresponding data signal directly, for example. For the remaining sets of input states and selection signals pertaining to each other, the input states are derived by inverting a state of the corresponding data signal, whereas the pertaining selection signals are derived by taking the state of the corresponding data signal directly, for example.

To achieve a division factor of three, a second data signal of the plurality of at least two data signals can be used as the output clock signal. To get a higher division ratio, further data signals can be derived by processing respective preceding data signals. The output clock signal in these cases can be derived from the last processed data signal.

To achieve a division ratio of five, for example, the output clock signal can be derived by deriving a third input state of the plurality of at least two input states and a third selection signal of the plurality of at least two selection signals from the second data signal. The third input state is forwarded either at the rising clock edge of the input clock signal or at the falling clock edge of the input clock signal, depending on the third selection signal. In other words, a state of a preceding data signal, in this case the second data signal, decides whether a forwarding of the preceding data signal is triggered by a rising clock edge or by a falling clock edge of the input clock signal.

DETAILED DESCRIPTION OF THE DRAWINGS

Figure 1:
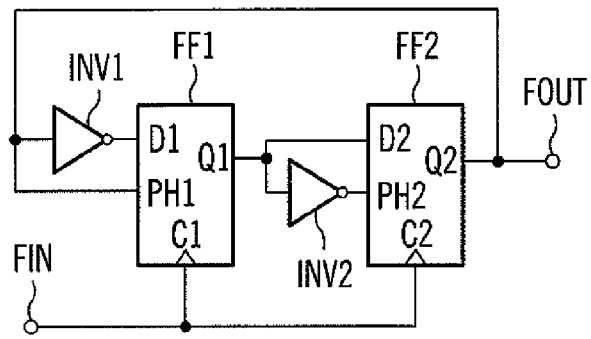
FIG. 1 shows a first exemplary embodiment of a frequency divider.

FIG. 1 shows an exemplary embodiment of a frequency divider which comprises a first and a second triggered delay element FF1, FF2. Each of the delay elements FF1, FF2 has a data input D1, D2, a clock input C1, C2, a trigger control input PH1, PH2 and a data output Q1, Q2. The frequency divider further comprises a reference frequency input FIN which is coupled to the clock inputs C1, C2. A data input D1 of the first delay element FF1 is coupled to a clock output FOUT by first inverting means INV1. The clock output FOUT is further coupled to the trigger control input PH1 of the first delay element FF1 directly, for example without means to change the logical state of a respective signal. The data output Q1 of the first delay element FF1 is coupled to the data input D2 of the second delay element FF2 directly and to the trigger control input PH2 of the second delay element FF2 by second inverting means INV2. Hence the coupling, either directly or by inverting means, at the input of the second delay element FF2 is done in a complementary fashion with respect to the coupling at the input of the first delay element FF1. The data output Q2 of the second delay element FF2 is coupled to the clock output FOUT.

The delay elements FF1, FF2 are configured to forward an input state of a signal at the respective data input D1, D2 depending on a clock edge of an input clock signal provided at the reference frequency input FIN. In other words, the data signal or the respective input state is forwarded to the respective data output Q1, Q2, if a clock edge in the input clock signal is detected. A state of a selection signal at the trigger control input PH1, PH2 of the delay elements FF1, FF2 determines whether a positive or rising clock edge or a negative or falling clock edge is used for the forwarding of the data signal or state of the data signal, respectively.

To this end the first delay element FF1 is provided with the output clock signal at the clock output FOUT as a first selection signal and the second delay element is provided with an inverted version of the data signal at the output Q1 of the first delay element D1 as a second selection signal. As the selection signals switch their state together with the respective input data signals at the data inputs D1, D2, a forwarding of the input states is triggered for different types of clock edges at succeeding trigger instants. This results in an odd number of clock edges between two trigger instants and, therefore, to an odd division ratio. As the triggering at rising and falling clock edges is performed symmetrically, a duty cycle of a clock signal at the output of the delay elements is balanced to a value of 50%.

Figure 2:
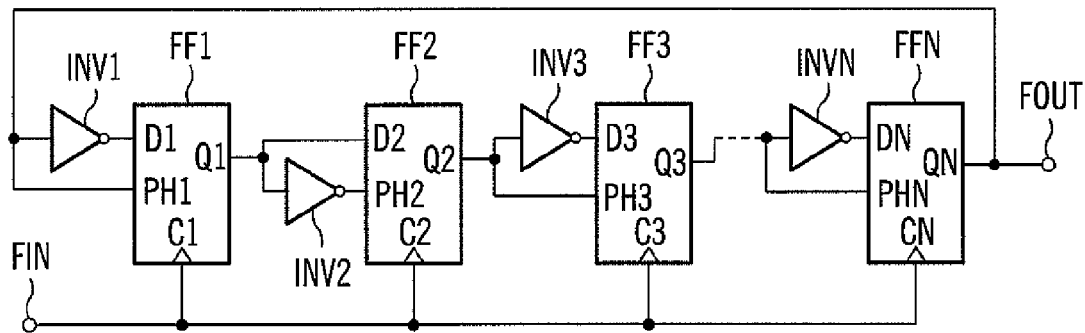
FIG. 2 shows a second exemplary embodiment of a frequency divider.

FIG. 2 shows another embodiment of a frequency divider having an odd division ratio. In this embodiment, the frequency divider further comprises a third and further triggered delay elements FF3, FFN, which are arranged as a cascade of triggered delay elements. The function or structure of the further delay elements FF3, FFN is basically the same as of the first and the second delay elements FF1, FF2. A data input D3 of the third delay element FF3 is coupled to the data output Q2 of the second delay element FF2 by third inverting means INV3, whereas its trigger control input PH3 is coupled to the data output Q2 directly. In a similar way, the data input DN of the delay element FFN is coupled to a data output of a preceding delay element which is not shown here for the reason of a better overview, by inverting means INVN, whereas the trigger control input PHN is coupled to that data output directly. A data output QN of the delay element FFN is coupled to the clock output FOUT.

It can be seen from the embodiment of FIG. 2 that a position of respective inverting means INV1, INV2, INV3, INVN is chosen such that one of the inverting means is arranged at or before a trigger control input, whereas the remaining inverting means are arranged at respective data inputs. For example in this embodiment the second inverting means INV2 are arranged at or before the second trigger control input PH2, whereas the remaining inverting means INV1, INV3, INVN are arranged at or before the data inputs D1, D3, DN of the first, the third and the N-th delay element FF1, FF3, FFN. Therefore, for example, a fourth delay element would have inverting means coupled to its data input.

In other words, the clock input C1, C2, . . . of each of the number of delay elements FF1, FF2, . . . is coupled to the reference frequency input FIN. The data input D1 and the trigger control input PH1 of the first delay element FF1 of the cascade are coupled to the clock output FOUT, wherein one input of the data input D1 and the trigger control input PH1 is coupled to the clock output FOUT by first inverting means INV1. In this embodiment the data input D1 is coupled to the clock output FOUT by the first inverting means INV1 and the trigger control input PH1 is coupled to the clock output FOUT directly.

In other embodiments the position or arrangement of the inverting means can be exchanged so that respective inverting means INV1 are arranged at the trigger control input PH1 of the first delay element FF1 instead of the data input D1. In this case the position of further inverting means INV2, INV3, INVN would be at respective data inputs D2, D3, DN of the further delay elements FF2, FF3, FFN of the cascade. In other embodiments inverting means INVN of the last delay element FFN could also be arranged at the respective trigger control input PHN, wherein in this case no inverting means would be provided at the data input DN of the delay element FFN. A position of the remaining inverting means INV1, INV2, INV3 can be determined according to the description given above, namely at respective data inputs D1, D2, D3.

With the frequency divider comprising N triggered delay elements, an odd division ratio of 2N−1 can be achieved with reference to an input clock signal at the reference frequency input FIN and an output clock signal at the clock output FOUT using a given integer number N of delay elements.

Figure 3:
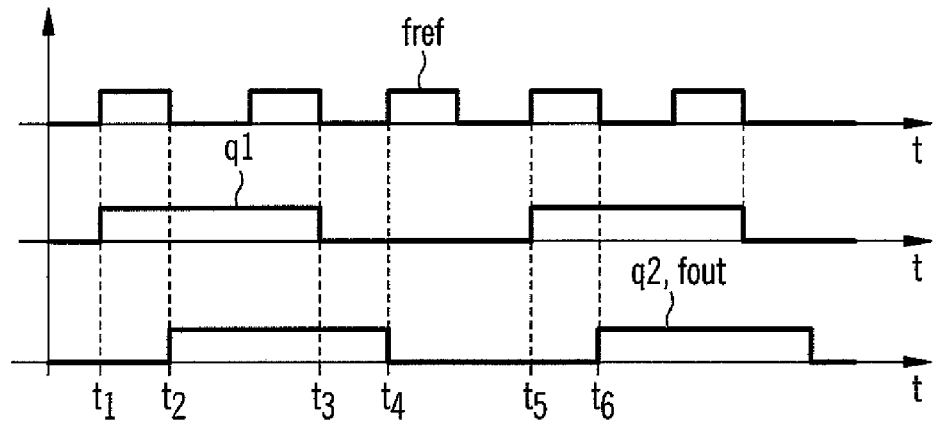
FIG. 3 shows an exemplary signal diagram of signals processed in a frequency divider.

FIG. 3 shows a signal diagram of signals processed in an embodiment of a frequency divider as described above. An input clock signal fref is provided at the reference frequency input FIN. The input clock signal has a square wave form and a duty cycle of 50%. At the first rising clock edge of the input clock signal fref at a time instant t1, a state of a first data signal q1 at the data output Q1 changes to a logic high state. As the second delay element FF2 receives an inverted version of the first data signal q1 at its trigger control input PH2 as a second selection signal, it is in this case configured to detect falling clock edges of the input clock signal fref. Therefore, at the time instant t2, the state of the first data signal q1 is transferred to the state of a second data signal q2 at the data output Q2 of the second delay element FF2. For a frequency division by three, the second data signal q2 corresponds to the output clock signal fout.

Because of the state of the output clock signal fout, the first delay element FF1 is configured to detect a falling clock edge of the input clock signal fref at a time instant t3 such that the inverted state of the output clock signal fout is transferred to the state of the first data signal q1. In other words, the first data signal q1 changes from a high state to a low state at the instant t3.

Accordingly, at a time instant t4, the state of the output clock signal fout changes to a low state. Further logic states of the data signals q1, q2 at the time instants t5, t6 correspond to the states at the time instants t1, t2.

As can be seen from FIG. 3, a change of the logic states of the data signals q1, q2 occurs for every third clock edge of the input clock signal fref when counting falling and rising clock edges. This results in a frequency division by a division ratio of three.

Figure 4:
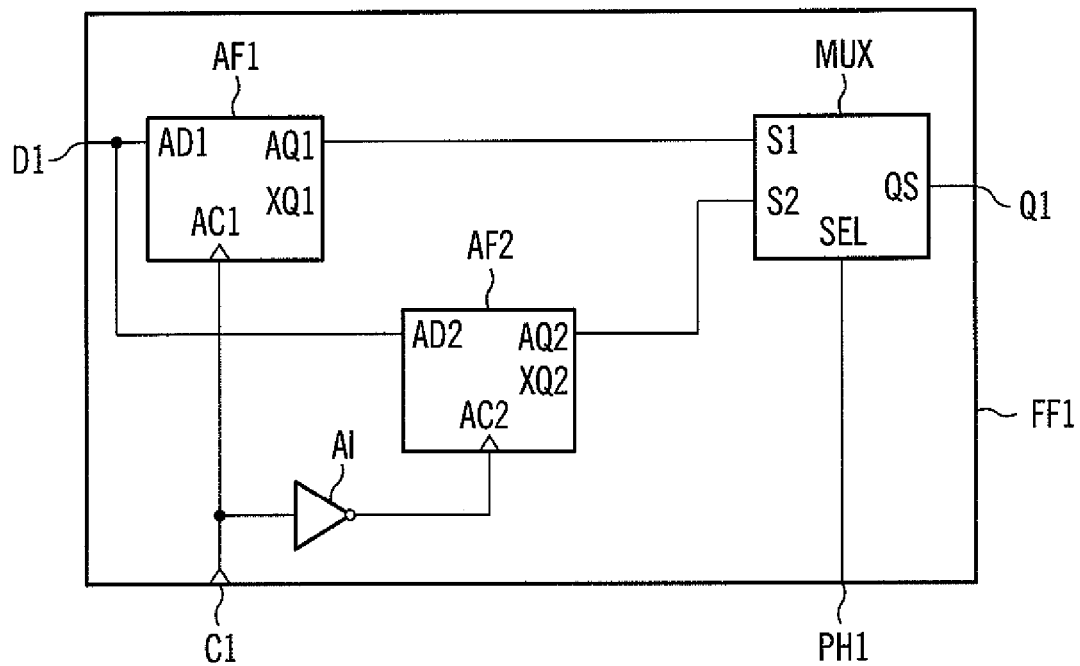
FIG. 4 shows an exemplary embodiment of a triggered delay element.

FIG. 4 shows an exemplary embodiment of a trigger delay element which can be used in the embodiments of frequency dividers described above. The delay element FF1 comprises a first and a second auxiliary delay element AF1, AF2 and a selection unit MUX. The auxiliary delay elements AF1, AF2 each have an auxiliary data input AD1, AD2, a clock input AC1, AC2 and an auxiliary data output AQ1, AQ2. The auxiliary data inputs AD1, AD2 are coupled to the data input D1 of the triggered delay element FF1. The clock input AC1 of the first auxiliary delay element AF1 is coupled to the clock input C1 of the trigger delay element FF1 directly, whereas the clock input AC2 of the second auxiliary delay element AF2 is coupled to the clock input C1 by auxiliary inverting means AI. The auxiliary data outputs AQ1, AQ2 are coupled to a first and a second signal input S1, S2 of the selection unit MUX. The selection unit MUX further has a selection input SEL which is coupled to the trigger control input PH1. A signal output QS is coupled to the data output Q1 of the triggered delay element FF1.

The auxiliary delay elements AF1, AF2 can further comprise inverted auxiliary data outputs XQ1, XQ2, which provide inverted versions of the states or signals at the auxiliary data outputs AQ1, AQ2.

The first and the second auxiliary delay element are configured to forward a state of an input signal and the respective auxiliary data input AD1, AD2 to their respective auxiliary data output AQ1, AQ2 depending on a clock edge of a clock signal at the respective clock input AC1, AC2. The first and the second auxiliary delay element AF1, AF2, for example, comprise a conventional D-flip-flop circuit.

The selection unit MUX is configured to couple the first or the second signal input S1, S2 to the signal output QS depending on a selection signal at the selection input SEL.

The first and the second auxiliary delay element AF1, AF2 may have the same structure and/or function. For example, both auxiliary delay elements AF1, AF2 are configured to detect a positive clock edge of a clock signal at their clock input AC1, AC2. As the second auxiliary delay element AF2 is provided with an inverted version of a clock signal at the clock input C1, the first auxiliary delay element AF1 detects rising clock edges of the input clock signal at the clock input C1 and the second auxiliary delay element AF2 detects falling clock edges of the input clock signal. An input state of the data signal at the data input D1 or the auxiliary data inputs AD1, AD2, respectively, is forwarded depending on a respective clock edge detection. Depending on a selection signal at the trigger control input PH1, the selection unit MUX forwards a first auxiliary data signal based on the detection of a rising clock edge or a second auxiliary data signal based on the detection of a falling clock edge as an output data signal to the data output Q1. In other words, the selection signal determines whether a data signal or the state of a data signal at the data input D1 is forwarded at the rising clock edge or at a falling clock edge of the input clock signal at the clock input C1.

The inverting means INV1, INV2, . . . , AI of the frequency divider can comprise a logic inverter circuit which, for example, is transistor-based. Furthermore, the signals and the respective signal lines can be in a differential form such that each of the data or clock signals comprises a first and a second component which are complementary to each other with respect to a reference signal. In this case, it is also possible to derive inverted versions of the differential signals by swapping the complementary components of the respective differential signal. This can, for example, be effected by swapping respective differential signal lines.

If in other embodiments the auxiliary delay elements AF1, AF2 comprise inverted auxiliary data outputs XQ1, XQ2, the selection unit MUX can have two additional inputs and an additional output for selecting and forwarding of one of the signals at the auxiliary data outputs XQ1, XQ2, accordingly depending on the selection signal at the selection input SEL. In this case no additional inverting means are needed between the triggered delay elements FF1, . . . .

A frequency divider according to one of the embodiments described above has a balanced duty cycle of 50%. Small variations of the duty cycle, which can occur as an effect of transistor mismatch for example, are significantly smaller than those of conventional frequency dividers which also are affected by such effects.

Figure 5:
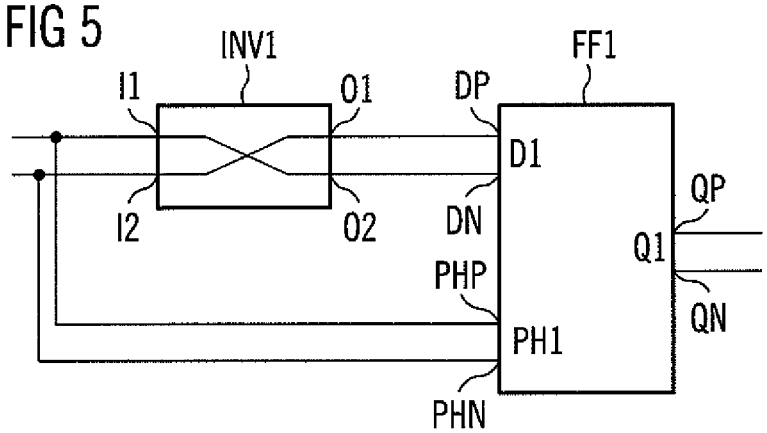
FIG. 5 shows an exemplary embodiment of a delay element with inverting means and FIG. 6 shows an exemplary embodiment of a frequency synthesizer.

FIG. 5 shows an exemplary embodiment of a delay element in combination with inverting means which can be used with differential signals. The data input D1 and the trigger control input PH1 of the delay element FF1 each are configured to receive input signals in differential form at respective input nodes DP, DN, PHP, PHN. Furthermore the data output Q1 comprises nodes QP, QN for providing differential signal components.

The inverting means INV1 comprise differential input nodes I1, I2 and differential output nodes O1, O2, wherein the input node I1 is coupled to the output node O2 and the input node I2 is coupled to the output node O1. In other words, the signal lines between input I1, I2 and output O1, O2 are swapped. As mentioned before, this results in an inversion of a respective signal provided to the inverting means INV1.

The nodes PHP, PHN of the trigger control input PH1 are coupled to the input I1, I2 of the inverting means INV1 without swapping the components. Therefore no inversion is performed in this case and the signal at the data input D1 and the signal at the trigger control input PH1 are inverted with respect to each other.

Figure 6:
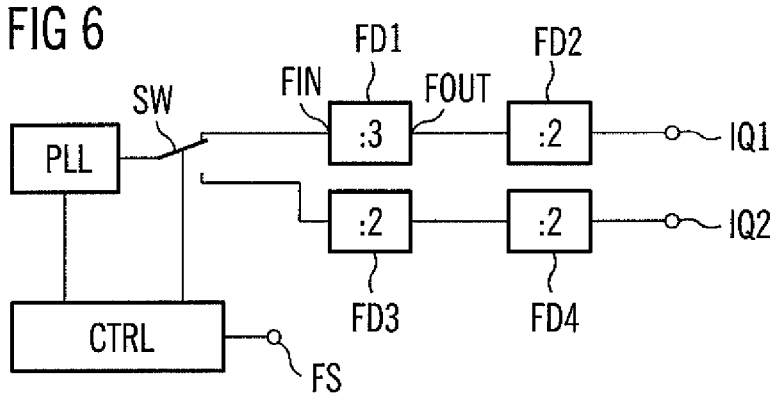

A frequency divider according to one of the embodiments described above can be used, for example, in a frequency synthesizer. FIG. 6 shows an exemplary embodiment of such a frequency synthesizer. It comprises a phase locked loop PLL, a control circuit CTRL, a switching element SW, and frequency dividers FD1, FD2, FD3, FD4. An output frequency of the frequency synthesizer is provided at a first signal output IQ1 from the phase locked loop PLL via the switching element SW and frequency dividers FD1, FD2 or at a second signal output IQ2 via the switching element SW and frequency dividers FD3, FD4, depending on a frequency selection signal at a control input FS.

To this end, the control circuit CTRL controls the frequency tuning of the phase locked loop PLL and the switching state of the switching element SW depending on the frequency selection signal. For example, complex frequency signals with in-phase and quadrature components, short I/Q components, can be generated by a frequency synthesizer having two different frequencies. For example, a first frequency of 315 MHz and a second frequency of 433 MHz can be generated at the first and the second signal output IQ1, IQ2, respectively. These frequencies can be used in different industrial, scientific, and medical, ISM bands. To this end, the phase locked loop PLL can generate two different base frequencies of, for example, 1890 MHz and 1732 MHz, which are frequency divided by the frequency dividers FD1 and FD2 or FD3 and FD4, respectively. The first frequency divider FD1 can be implemented with a division ratio of three as shown in one of the embodiments described above. The second frequency divider FD2 can be a so-called Johnson divider which provides both a frequency division by a division ratio of two and a phase shift 90° to produce the respective I/Q signals. Accordingly, the third frequency divider FD3 can be a conventional frequency divider by two, whereas the fourth frequency divider FD4 can also be implemented as a Johnson divider. Compared to an embodiment, where only a single division ratio, for example by four, is implemented, a tuning range of the phase locked loop PLL can be reduced.

For example, when employing a common division ratio of four, base frequencies at the output of the phase locked loop PLL of 1260 MHz and 1732 MHz would be needed, according to 4*315 MHz=1260 MHz and 4*433 MHz=1732 MHz.

The base frequencies needed in the embodiment shown in FIG. 5 which result from 6*315 MHz=1890 MHz and 4*433 MHz=1732 MHz therefore require a smaller tuning range which can be achieved with less effort than the tuning range of the conventional frequency synthesizer.

As a Johnson divider is sensitive to a balanced duty cycle of its input clock signal, a better function of the frequency synthesizer can be provided by using a frequency divider with an odd division ratio according to one of the embodiments described above.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A frequency divider, comprising:
 a cascade of at least two triggered delay elements, each having a data input, a clock input, a trigger control input and a data output, the delay elements configured to forward a state of an input signal at their respective data input to their respective data output, wherein it depends on a control signal at the respective trigger control input of the delay element whether the state is forwarded either for a rising clock edge of a clock signal at their respective clock input or for a falling clock edge of the clock signal;
 a reference frequency input; and
 a clock output;
 wherein the clock input of each of the delay elements of the cascade is coupled to the reference frequency input;
 wherein the data input and the trigger control input of the first delay element of the cascade are coupled to the data output of the last delay element of the cascade;
 wherein the data input and the trigger control input of further delay elements of the cascade are coupled to the data output of a respective preceding delay element of the cascade;
 wherein the clock output is coupled to the data output of the last delay element of the cascade;
 wherein the trigger control input of one of the delay elements of the cascade is coupled to the corresponding data output by inverting means; and
 wherein the respective data input of the other delay elements of the cascade is coupled to the corresponding data output by respective inverting means.

2. The frequency divider according to claim 1, wherein at least one of the triggered delay elements comprises:
 a selection unit having a first and a second signal input, a signal output, which is coupled to the data output of the at least one triggered delay element, and a selection input, which is coupled to the trigger control input of the at least one triggered delay element, the selection unit configured to couple the first or the second signal input to the signal output depending on a selection signal at the selection input; and
 a first and a second auxiliary delay element each having an auxiliary data input, a clock input and an auxiliary data output, the auxiliary delay elements configured to forward a state of an input signal at their respective auxiliary data input to their respective auxiliary data output depending on a clock edge of a clock signal at their respective clock input;
 wherein the auxiliary data inputs are coupled to the data input of the at least one triggered delay element;
 wherein the auxiliary data outputs are coupled to the first and the second signal input;
 wherein the clock input of the first auxiliary delay element is coupled to the clock input of the at least one triggered delay element; and
 wherein the clock input of the second auxiliary delay element is coupled to the clock input of the at least one triggered delay element by auxiliary inverting means.

3. The frequency divider according to claim 1, which is configured to be operated with differential signals.

4. The frequency divider according to claim 3, wherein at least one of the inverting means comprises swapped differential lines.

5. The frequency divider according to claim 1, wherein at least one of the inverting means comprises an inverter circuit.

6. A frequency divider, comprising:
 a first and a second triggered delay element, each having a data input, a trigger control input and a data output, the delay elements configured to forward a state of an input signal at their respective data input to their respective data output, wherein it depends on a control signal at the respective trigger control input of the delay element whether the state is forwarded either for a rising clock edge of an input clock signal or for a falling clock edge of the input clock signal; and
 a clock output;
 wherein the data input and the trigger control input of the first delay element are coupled to the clock output, wherein one input of said data input and said trigger control input is coupled to the clock output by first inverting means;
 wherein the data input and the trigger control input of the second delay element are coupled to the data output of the first delay element, wherein one input of said data input and said trigger control input is coupled to said data output by second inverting means in a complementary fashion with respect to the first delay element; and
 wherein the clock output is coupled to the data output of the second delay element.

7. A method for frequency division, comprising:
 providing an input clock signal;

deriving a first input state of a plurality of at least two input states from a last data signal of a plurality of at least two data signals;

deriving a first selection signal of a plurality of at least two selection signals from the last data signal, the first selection signal pertaining to the first input state;

deriving a first data signal of the plurality of at least two data signals by forwarding the first input state, wherein it depends on the first selection signal whether the first input state is forwarded either at a rising clock edge of the input clock signal or at a falling clock edge of the input clock signal;

deriving a further input state of the plurality of at least two input states from a respective preceding data signal of the plurality of at least two data signals;

deriving a further selection signal of the plurality of at least two selection signals from the respective preceding data signal, the further selection signal pertaining to the further input state;

deriving a further data signal of the plurality of at least two data signals by forwarding the further input state, wherein it depends on the further selection signal whether the further input state is forwarded either at a rising clock edge of the input clock signal or at a falling clock edge of the input clock signal; and deriving an output clock signal from one data signal of the plurality of at least two data signals;

wherein one of the plurality of at least two selection signals is derived by inverting the corresponding data signal and wherein the input states not pertaining to said one selection signal are derived by inverting the corresponding data signals.

8. The method according to claim 7, wherein deriving of a respective data signal of the plurality of at least two data signals comprises:

deriving a first auxiliary data signal by forwarding the respective state at a rising clock edge of the input clock signal;

deriving a second auxiliary data signal by forwarding the respective state at a falling clock edge of the input clock signal; and selecting the first or the second auxiliary data signal as the respective data signal depending on the respective selection signal.

9. The method according to claim 7, wherein the signals processed are in a differential form.

10. The method according to claim 9, wherein inverted versions of differential signals are derived by swapping complementary components of the respective differential signal.

* * * * *